United States Patent [19]

Lakritz et al.

[11] Patent Number: 4,545,610

[45] Date of Patent: Oct. 8, 1985

[54] METHOD FOR FORMING ELONGATED SOLDER CONNECTIONS BETWEEN A SEMICONDUCTOR DEVICE AND A SUPPORTING SUBSTRATE

[75] Inventors: Mark N. Lakritz, Wappingers Falls; Jose Ordonez, Pleasant Valley; Peter J. Tubiola, Wappingers Falls, all of N.Y.

[73] Assignee: International Business Machines Corporation, Armonk, N.Y.

[21] Appl. No.: 555,264

[22] Filed: Nov. 25, 1983

[51] Int. Cl.$^4$ ............................................. H01L 21/44
[52] U.S. Cl. ................................. 29/589; 29/578; 29/576 R; 29/576 J; 29/591; 357/65; 357/68; 174/68.5; 339/17 B
[58] Field of Search ................. 29/577, 582, 589, 590, 29/591, 578; 357/65, 67, 68, 71; 148/1.5; 174/68.5, 52 R; 339/17 B, 17 C

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller | 29/840 |
| 3,458,925 | 8/1969 | Napier et al. | 29/578 |
| 3,486,223 | 4/1967 | Butera | 29/626 |
| 3,591,839 | 7/1971 | Evans | 29/591 X |
| 3,621,565 | 11/1971 | Sandstrom et al. | 29/590 |
| 3,811,186 | 5/1974 | Larnerd | 29/626 |
| 3,871,015 | 3/1975 | Lin et al. | 357/67 |
| 3,921,285 | 11/1975 | Krall | 29/626 |
| 3,997,963 | 12/1976 | Riseman | 29/591 X |
| 4,155,155 | 5/1979 | Bourdon et al. | 29/591 X |
| 4,184,043 | 1/1980 | Hildering | 29/589 X |

OTHER PUBLICATIONS

Sideris, "Bumps and Balls, Pillars and Beams: A Survey of Face Bonding Methods", Electronics, Jun. 28, 1965, pp. 68–73.
IBM TDB, vol. 16, No. 3, Aug. 1973, p. 767.
IBM TDB, vol. 19, No. 4, Sep. 1976, p. 1178.
IBM TDB, vol. 23, No. 2, Jul. 1980, p. 575.
IBM TDB, vol. 17, No. 2, Jul. 1974, p. 627.

Primary Examiner—Brian E. Hearn
Assistant Examiner—David A. Hey

[57] ABSTRACT

A process for forming elongated solder terminals to connect a plurality of pads on a semiconductor device to a corresponding plurality of pads on a supporting substrate by, forming a means to maintain a predetermined vertical spacing between the semiconductor and the supporting substrate outside the area of the pads, forming and fixing solder extenders to each of the solder wettable pads on the substrate or the device to be joined, positioning the semiconductor device provided with solder mounds on the solder mountable pads over the supporting substrate with the solder mound in registry and with the pads on the substrate with the solder extenders positioned therebetween, the means to maintain vertical spacing located between and in abutting relation to the device and substrate, and heating the resulting assembly to reflow the solder mounds and the solder extenders while maintaining a predetermined spacing thus forming a plurality of hour-glass shaped elongated connections.

12 Claims, 2 Drawing Figures

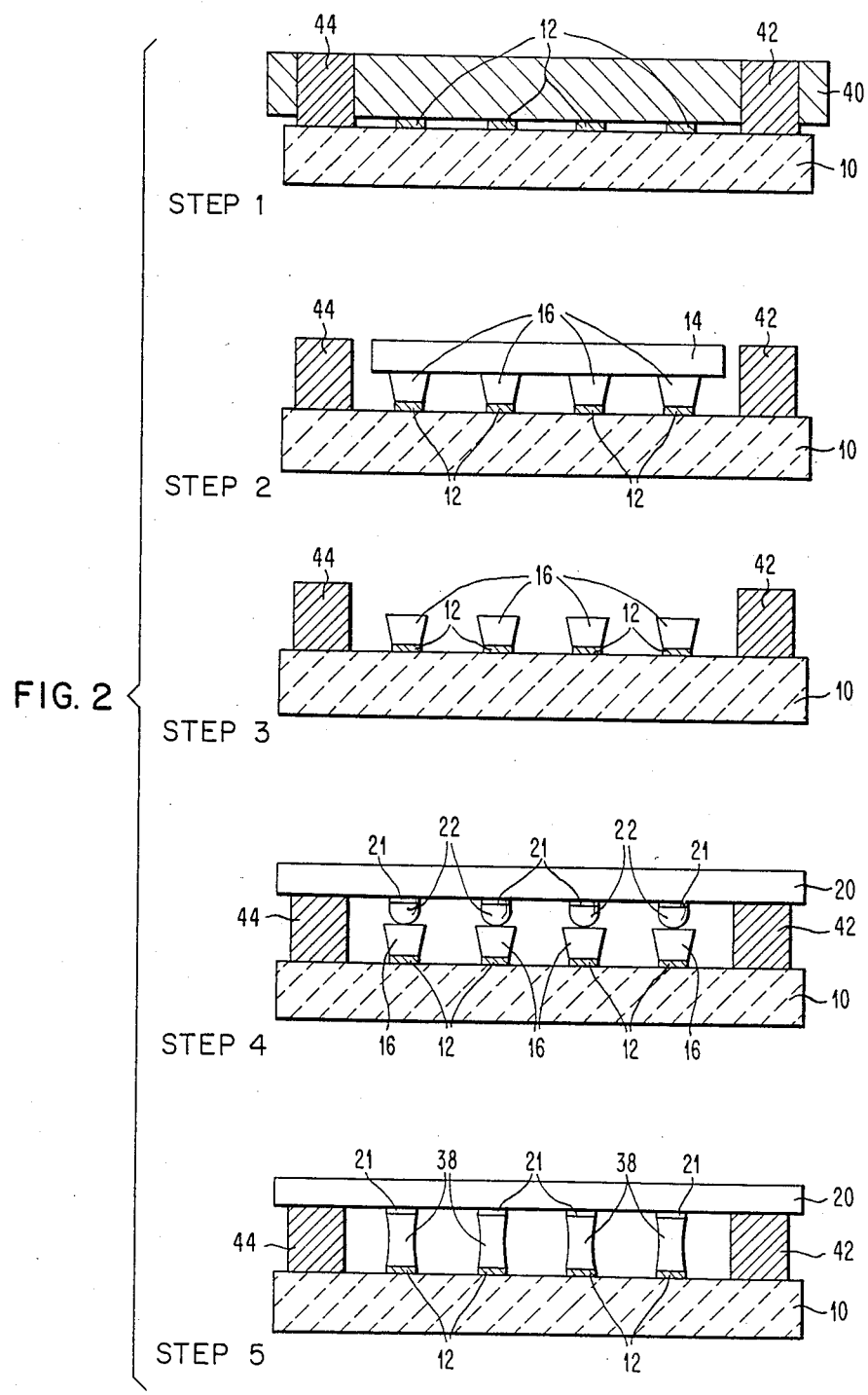

METHOD FOR FORMING ELONGATED SOLDER CONNECTIONS BETWEEN A SEMICONDUCTOR DEVICE AND A SUPPORTING SUBSTRATE

DESCRIPTION

Technical Field

This invention relates to methods of solder joining a microminiature component to a supporting board or substrate, and more particularly to a method of forming joints that are elongated in the longitudinal direction to provide improved resistance to lateral stress.

The present invention involves the face down or flip chip bonding of a semiconductor device to a substrate wherein a plurality of electrical connections between the device and the supporting board or substrate are formed by very small and closely spaced solder interconnections.

The present invention is an improvement in the solder reflow controlled collapse chip connection technology. The U.S. Pat. Nos. 3,401,126 and 3,429,040 Louis F. Miller and assigned to the assignee of the present patent application describes in detail the controlled collapse connection technique of face-down bonding of semiconductor chips to a carrier. In general, what is described and claimed in those patents is the formation of a malable pad of metallic solder on the semiconductor chip contact site and solder joinable sites on the conductors on the chip carrier. The chip carrier solder joinable sites are surrounded by non-solderable barriers so that when the solder on the carrier sites and the semiconductor device contact sites melt and merge, surface tension holds the semiconductor chip suspended above the carrier.

With the development of the integrated circuit semiconductor device technology, the size of individual active and passive elements have become very small, and the number of elements in a device has increased dramatically. This results in significantly larger device sizes with larger numbers of I/O terminals. This trend will continue and will place increasingly higher demands on terminal density and overall numbers. An advantage of solder joining is that the I/O terminals can be distributed over substantially the entire top surface of the device. This allows an efficient use of the entire surface, which is more commonly known as area bonding.

Normally the integrated circuit devices are mounted on supporting substrates made of materials with coefficients of expansion that differ from the coefficient of expansion of the material of the semiconductor device, i.e. silicon. In use the elements of the device inevitably generate heat resulting in temperature fluctuations in both the device and the supporting substrate since the heat is conducted through the solder bonds. The device and the substrate expand and contract in different amounts with temperature fluctuations, due to the difference in coefficient of expansion. This imposes stresses on the solder terminals. The stress on the solder bond during operation is directly proportional to (1) the magnitude of the temperature fluctuations, (2) the distance from the neutral point, and (3) the difference in the coefficients of expansion of the device and substrate, and inversely proportioned to the height of the solder bond, i.e. the spacing between the device and the support substrate. The seriousness of the situation is further compounded by the fact that as the solder terminals become smaller in diameter to accommodate the need for greater density, the overall height also decreases.

It is widely recognized that a potential solution that will permit using solder terminals for future applications involving larger devices with more dense terminals is in elongating the solder terminal. Various techniques have been proposed to achieve this objective as disclosed in U.S. Pat. Nos. 3,811,186, 3,486,223, 3,921,285 and also in IBM TDB Aug. 1973 P. 767, Sept. 1976 P. 1178, and Jul. 1980 P. 575. It has also been discovered that an hour-glass-shaped solder terminal is superior to a cylindrical or barrel-shaped terminal for withstanding stress, where both have the same height. This phenomena is explained in IBM Journal of Research and Development May 1969 Vol. 13 No. 3 P. 261.

While the aforementioned references clearly disclose the objective of elongating solder terminals to reduce stress, the methods of achieving the elongation are not practical in a manufacturing environment. In general, the techniques described require personalized operations that depend on an operator's skill, and personal dedication to carry out the process. This environment is usually not available in a manufacturing environment.

DISCLOSURE OF THE INVENTION

In accordance with the present invention we provide a new method for forming elongated solder terminal connections between an integrated circuit semiconductor device and a supporting substrate, which elongated connections are resistant to stresses imposed by thermal fluctuation of the device and substrate.

Another objective of our invention is to provide a method for elongating solder joints that is feasible in a large scale manufacturing environment.

In accordance with the aforementioned objective the process of our invention for forming elongated solder terminals includes the steps of (1) forming a means to maintain a predetermined vertical spacing between the semiconductor device and the supporting substrate, (2) forming and affixing solder extenders to each of the solder wettable pads on the substrate or device, (3) positioning the semiconductor device, having solder mounds on the solder wettable pads, over the supporting substrate with the solder mounds in registry with pads on the substrate, and with the solder extenders bridging the distance between the device and substrate with the means to maintain vertical spacing located between and in abutting relation to the device and supporting substrate, and heating the resultant assembly to reflow the solder mounds and said solder extenders while maintaining a predetermined spacing thus forming a plurality of hour-glass shaped elongated connections.

BRIEF DESCRIPTION OF THE DRAWINGS

The details of our invention will be described in connection with the accompanying drawings in which

FIG. 2 is a sequence of elevational views illustrating a second embodiment of our invention for forming elongated solder connections between a device and a supporting substrate.

DETAILED DESCRIPTION OF THE INVENTION

Figure 1:
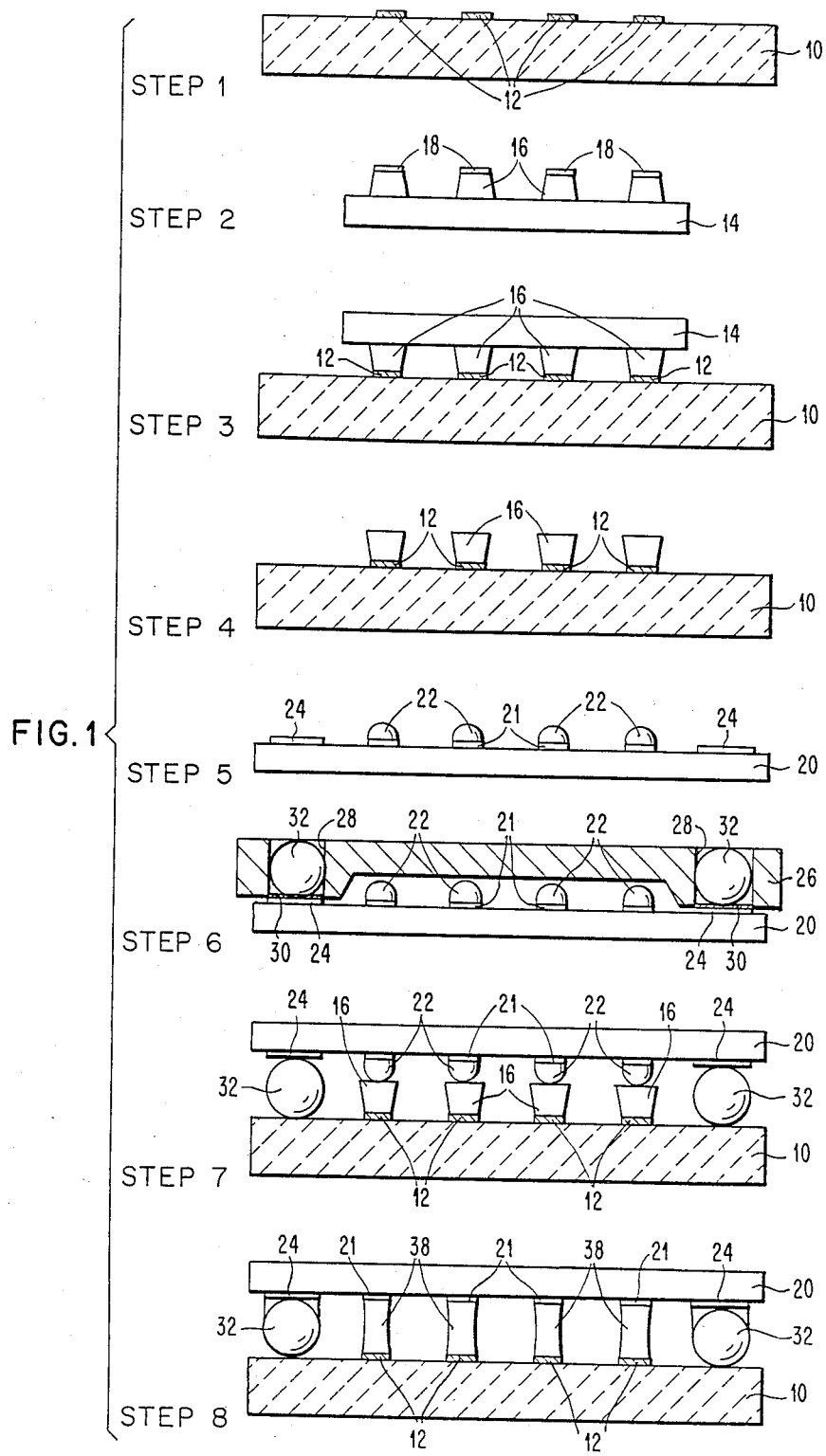
FIG. 1 is a sequence of elevational views of a substrate and device which illustrate the various process steps of a preferred embodiment of the process of our invention for forming elongated solder connections.

Referring now to the drawings, step 1 of FIG. 1 in particular, there is illustrated a typical substrate 10 to which a device can be bonded. The substrate 10 has a set of solder wettable pads 12 mounted on a ceramic base with either an internal metallurgy system that interconnects the pads with pins (not shown) and other associated devices, and/or a metallurgy formed on the top surface. In the interest of clarity only a single set of pads is shown. In practice the substrate can have many sets of pads for a connection to many devices, as shown in U.S. Pat. No. 4,245,273. The metallurgy can be located on the surface, or on the surface and also internally, if desired. Substrate 10 is illustrative of a general type substrate, which substrate structure does not constitute part of the invention. In general, the substrate 10 is formed of a ceramic material which normally has a coefficient of expansion that differs from the coefficient of expansion of silicon, the material used to form the semiconductor device to be bonded to the substrate.

Step 2 shows a blank silicon substrate having bonded thereto solder extenders 16 formed of a suitable solder alloy having a relatively high melting point. Typically the solder extenders will be formed of pure Pb or a solder with a very high Pb composition. The melting point of the extender should be material of the order of 327° C. On the top surface of each of extenders 16 is a layer 18 of a low melting metal, typically tin with a thickness in the range of 400 to 600A and a melting point on the order of 240° C. The solder extenders 16 are formed by placing a suitable apertured mask having the pad configuration corresponding to the pad configuration on substrate 10, and vapor depositing the solder alloy on the substrate 14 to the appropriate desired depth, typically in the range of 2 to 4 mils. The low melting layer 18 is subsequently deposited on the top surfaces of the extenders also by vapor deposition. As indicated in step 3, the blank silicon substrate 14 with the extenders 16 is then inverted and placed on the top surface of substrate 10 with the layer 18 1n contact with the surface of pad 12. The solder extenders 16 are transferred to the substrate by heating the resultant assembly to a temperature sufficient to melt the layer 18 and subsequently cooling to fuse the extenders to the pads 12. The blank silicon substrate 14 can then be conveniently removed leaving the structure illustrated in step 4. The integrated circuit semiconductor device 20 to be bonded to substrate 10 is illustrated in step 5. Device 20 has a plurality of solder mounds 22 arranged in a configuration to match the configuration of solder pads 12 on substrate 10. The solder terminals 22 each consists of a solder wettable pad structure 21 with a mound of solder reflowed thereto on the top surface. As indicated, the peripheral portion of device 20 extends outwardly beyond the solder terminals 22. Device 20 is conventional and consists of many active and passive semiconductor elements interconnected with a suitable metallurgy system (not shown). On the peripheral portion of device 20 there is provided solder wettable pads 24 which are normally fabricated along with the pads 21 on device 20. Any suitable number of pads can be provided since they form the basis for the means to maintain a predetermined vertical spacing between the semiconductor device and the substrate. In general a minimum of three pads per device structure must be provided although more can be used if desired. The means for maintaining the spacing is fabricated as shown in step 6. A mask 26 having apertures 28 that overlie pads 24 is placed on the top surface of device 20. A thin layer of solder 30 is vapor deposited on the top surface of pads 24 by conventional vapor deposition techniques. Metal spheres 32 having a diameter approximately the desired spacing of the substrate and the device are placed in apertures 28 and the assembly heated to melt the layer 30 and subsequently cooled to join the spheres to the device 20. The metal spheres can be any suitable metal but are preferably formed of copper with a nickel coating on the surface with an overlying coating of gold. The spheres will normally have a diameter in the order of 5 mils. More generally, the diameter of the spheres 32 is preferably such to provide a length of the solder terminals wherein the ratio of the height of width is greater than 1. The process for producing metal spheres 32 suitable for the practice of the method of our invention is described in *IBM Journal of Research Development*, May 1969, Page 234. The process of making copper balls is not part of this invention. After the mask 26 is removed the assembly is inverted and placed into position on substrate 10 having extenders 16 on the pads as shown in step 7. As illustrated the spheres 32 provide standoffs that maintain the desired spacing between the device and the substrate, and each I/O pad on the device is connected to a corresponding pad on the substrate with the solder mounds in contact with a solder extender. The assembly is then heated to a temperature sufficient to melt the material of the extender 16 and the solder mound 22 thus forming elongated hour-glass shaped solder connections 38 between the pads on the device and the substrate. The total amount of solder in the extenders 16 and the solder mound 22 is calculated, considering the spacing between pads to provide the hour-glass shaped connections.

Referring now the FIG. 2 of the drawings there is depicted a second sequence of steps illustrating a second preferred embodiment of the process of our invention. In this embodiment the substrate 10 can be any suitable support for a semiconductor device as discussed previously in the description of the first preferred embodiment. Substrate 10 can also be an unsintered ceramic substrate, as for example an MLC substrate. A mask 40 with aperture 42 is positioned on the top surface of substrate 10 with openings 42 positioned over the desired locations of the standoff to be fabricated. A metal paste consisting of a particulate metal, preferably refractory material such as molybdenum, tantalum or tungsten combined with a suitable vehicle is screened into openings 42 forming standoff elements 44. Following the screening operation mask 40 is removed and the assembly sintered thereby driving off the vehicle plasticizers, etc. in the paste and also the binders in the green ceramic substrate 10 if the substrate has not been previously sintered. The height of the standoff 44 after sintering corresponds to the desired spacing between the device to be positioned on the substrate and the substrate 10. Any shrinkage due to sintering must be accommodated by increasing the thickness of mask 40. The solder extenders 16 shown in FIG. 2 adhered to blank substrate 14 are fabricated in the same manner described in the previous embodiment. The blanking substrate 16 is positioned over the pads 12 and heated to fuse the extenders 16 to the pads and the blank substrate 14 is subsequently removed leaving the structure shown in step 3. As shown in step 4, a semiconductor device provided with solder mounds 22 is positioned over the substrate with the solder mounds in contact with the solder extenders 16 and the peripheral portion of the device in abutting contact with the standoff element 44. The assembly is then heated to reflow the solder element resulting in the structure illustrated in step 5 wherein the solder position 38 are elongated and have an hour-glass figure.

Obvious modifications can be made to the process embodiment described as for example the spherical standoffs that were adhered to the substrate in the first embodiment 10 could instead be adhered to pads mounted on the substrate 10 if desired. Further the location of the standoffs either on the device or the substrate can be varied to suit the individual application. Further the standoffs themselves can be used as an I/O or ground terminal provided that the necessary connections are made in the substrate and the semiconductor device.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A process for forming elongated solder terminals having hour-glass-like shapers to electrically connect a plurality of I/O solder wettable pads on a semiconductor device to a corresponding plurality of solder wettable pads on a supporting substrate comprising, forming a means to maintain a constant predetermined vertical spacing between said semiconductor device and said supporting substrate, said means being non-deformable at or below the temperature necessary to reflow the solder of the solder terminals, forming and affixing an extender formed of a low melting metal selected from the group consisting of Pb, Sn, and Pb-Sn alloy to each of said solder wettable pads on said substrate, positioning said semiconductor device having reflow solder mounds on said solder wettable pads over said supporting substrate with said solder mounds in registry and in contact with said solder extenders affixed to said pads on said substrate, said means to maintain vertical spacing located between and in abutting relation to said device and said support substrate, heating the resultant assembly to reflow said solder mounds and said solder extenders while maintaining a constant predetermined spacing thus forming a plurality of hour-glass shaped elongated connections.

2. The process of claim 1 wherein the ratio of the height of the elongated connection to the width of the solder wettable pad is equal to or greater than 1.

3. The process of claim 1 wherein said solder extenders are formed by vapor depositing a Pb-Sn solder through an apertured mask to a blank substrate, vapor depositing a thin low melting metal layer on the top surface of each extender element assembly and positioning it over and into contact with said solder settable pads on said support substrate, heating to melt said low melting layer and subsequently cooling to fuse the extender elements to the solder wettable pads, and removing the blank substrate.

4. The process of claim 1 wherein said extender elements are formed of Pb with a melting point of 327° C., and said low melting metal layer that is deposited on the top surface of said extender elements has a melting point equal to or less than 240° C.

5. The process of claim 1 wherein said extender elements, are formed of pure Pb, and said low melting metal layer is pure Sn.

6. The process of claim 1 wherein said means to maintain said constant predetermined vertical spacing between the semiconductor device and the supporting is comprised of forming a plurality of solder wettable standoff pads on said semiconductor device located outside of the area of said I/O solder wettable pads, depositing a layer of solder on said standoff pads, positioning metal spheres of a diameter equal to the desired said vertical spacing on said standoff pads, heating to melt said layer of solder, and cooling to secure the spheres to said standoff pads.

7. The process of claim 6 wherein said standoff pads are formed by providing solder wettable pads at the desired area locations, and depositing a layer of solder on the solder wettable pads.

8. The process of claim 7 wherein said layer of solder is deposited on said solder wettable pads through a mask, and said spheres are positioned in the openings in said mask and maintained in position on the device during the heating and cooling operations.

9. The process of claim 8 wherein said metal spheres are of Cu with a coating of Ni.

10. The process of claim 9 wherein the diameter of said spheres is of the order of 5 mils.

11. The process of claim 1 wherein said means to maintain a constant predetermined vertical spacing between the semiconductor device and supporting substrate is comprised of screen printing a plurality of refractory metal paste standoff bumps on said support substrate located outside of the area of I/O solder wettable pads, and sintering said standoff bumps.

12. The process of claim 11 wherein said standoff bumps have a height of the order of 5 mils after sintering.

* * * * *

UNITED STATES PATENT AND TRADEMARK OFFICE
CERTIFICATE OF CORRECTION

PATENT NO. : 4,545,610

DATED : October 8, 1985

INVENTOR(S) : Mark N. Lakritz et al.

It is certified that error appears in the above-identified patent and that said Letters Patent is hereby corrected as shown below:

Column 5, line 30, "shapers" should read -- shapes --.

Signed and Sealed this

Twenty-first Day of January 1986

[SEAL]

Attest:

DONALD J. QUIGG

Attesting Officer

Commissioner of Patents and Trademarks